(12) United States Patent
Chen

(10) Patent No.: US 7,901,975 B2
(45) Date of Patent: Mar. 8, 2011

(54) CONTINUOUS DEPOSITION PROCESS AND APPARATUS FOR MANUFACTURING CADMIUM TELLURIDE PHOTOVOLTAIC DEVICES

(76) Inventor: Yung-Tin Chen, Santa Clara, CA (US)

(*) Notice: Subject to any disclaimer, the term of this patent is extended or adjusted under 35 U.S.C. 154(b) by 168 days.

(21) Appl. No.: 12/383,747

(22) Filed: Mar. 28, 2009

(65) Prior Publication Data

US 2010/0184249 A1 Jul. 22, 2010

Related U.S. Application Data

(60) Provisional application No. 61/205,560, filed on Jan. 21, 2009.

(51) Int. Cl.
*H01L 21/00* (2006.01)
(52) U.S. Cl. .......................................... 438/94
(58) Field of Classification Search .................. None
See application file for complete search history.

(56) References Cited

U.S. PATENT DOCUMENTS

| | | | |
|---|---|---|---|
| 4,095,006 A | | 6/1978 | Jordan et al. |
| 4,873,198 A | * | 10/1989 | Meyers et al. ............... 438/94 |
| 5,215,631 A | * | 6/1993 | Westfall ................... 205/351 |
| 5,248,349 A | | 9/1993 | Foote et al. |
| 5,393,675 A | | 2/1995 | Compaan |
| 5,994,642 A | | 11/1999 | Higuchi et al. |
| 6,676,994 B2 | | 1/2004 | Birkmire et al. |
| 2010/0055826 A1 | * | 3/2010 | Zhong et al. ................ 438/84 |

* cited by examiner

*Primary Examiner* — Charles D Garber
*Assistant Examiner* — Andre' C Stevenson
(74) *Attorney, Agent, or Firm* — Bing K Yen

(57) ABSTRACT

A continuous deposition process and apparatus for depositing semiconductor layers containing cadmium, tellurium or sulfur as a principal constituent on transparent substrates to form photovoltaic devices as the substrates are continuously conveyed through the deposition apparatus is described. The film deposition process for a photovoltaic device having an n-type window layer and three p-type absorber layers in contiguous contact is carried out by a modular continuous deposition apparatus which has a plurality of processing stations connected in series for depositing successive layers of semiconductor films onto continuously conveying substrates. The fabrication starts by providing an optically transparent substrate coated with a transparent conductive oxide layer, onto which an n-type window layer formed of CdS or CdZnS is sputter deposited. After the window layer is deposited, a first absorber layer is deposited thereon by sputter deposition. Thereafter, a second absorber layer formed of CdTe is deposited onto the first absorber layer by a novel vapor deposition process in which the CdTe film forming vapor is generated by sublimation of a CdTe source material. After the second absorber layer is deposited, a third absorber layer formed of CdHgTe is deposited thereon by sputter deposition. The substrates are continuously conveyed through the modular continuous deposition apparatus as successive layers of semiconductor films are deposited thereon.

25 Claims, 7 Drawing Sheets

LIGHT

LIGHT

US 7,901,975 B2

CONTINUOUS DEPOSITION PROCESS AND APPARATUS FOR MANUFACTURING CADMIUM TELLURIDE PHOTOVOLTAIC DEVICES

RELATED APPLICATIONS

The present application is a continuation-in-part application of U.S. provisional patent application, Ser. No. 61/205,560, filed Jan. 21, 2009, for HYBRID SPUTTERING AND VAPOR TRANSPORT DEPOSITION PROCESS FOR MULTIPLE BAND-GAPPED CADMIUM TELLURIDE PHOTOVOLTAIC DEVICES, by Yung-Tin Chen, included herein by reference and for which benefit of the priority date is hereby claimed.

FIELD OF THE INVENTION

The present invention relates to a process and apparatus for manufacturing photovoltaic devices and more particularly to the process and apparatus for depositing thin film layers for cadmium telluride photovoltaic devices on a continuously conveying substrate.

BACKGROUND OF THE INVENTION

Photovoltaic technology offers great potential as an alternative source of electrical energy. Among various types of thin film solar cell technologies, cadmium telluride (CdTe) semiconductor based solar cells have emerged to be one of the leading candidates for large scale, low cost photovoltaic power. The band gap energy of CdTe (1.45-1.5 eV) is well suited for the terrestrial solar spectrum. A few micrometers (μm) of CdTe are sufficient to absorb most of the incident sunlight because of the high optical absorption coefficient thereof. As such, a carrier diffusion length of the order of one micrometer is sufficient to allow all the light generated carriers to be collected at the contact electrodes, which significantly relaxes the material quality requirements such as minimum grain size. This is in direct contrast with crystalline silicon solar cells which require several hundreds of micrometers of silicon owing to the indirect band gap structure thereof. Cadmium telluride which melts congruently is the only stable compound between cadmium and tellurium. This advantageous property permits deposition of near stoichiometric CdTe films by various methods including chemical bath deposition, sputter deposition and close spaced sublimation (CSS). Advances in CdTe technology have led to cell efficiencies of up to 16.5% demonstrated by the researchers from National Renewable Energy Laboratory (NREL).

FIG. 1 is a schematic cross-sectional view of a conventional CdTe thin film photovoltaic device including a glass substrate 21 through which radiant energy or light enters the device; a layer of front contact 23 made of a transparent conductive oxide (TCO) such as fluorine doped tin oxide ($SnO_2$:F) disposed on the substrate 21; an n-type cadmium sulfide (CdS) window layer 25 disposed on the front contact layer 23; a p-type CdTe absorber layer 27 deposited contiguously onto the CdS window layer 25, thereby forming a heterogeneous rectifying junction therebetween; and a layer of back contact 29 formed of copper and gold bilayers disposed on the CdTe absorber layer 27.

The photovoltaic device of FIG. 1 has a "superstrate" configuration because the glass substrate 21 is actually on top facing the sun light during operation. The glass substrate 21 is not only used as supporting structure during manufacturing and operation but also as window for transmitting light and as part of the encapsulation. Soda-lime glass which is limited to a maximum processing temperature of 500° C. is a commonly used substrate material because of its low cost. An alternative substrate material is borosilicate glass which can be processed up to a higher maximum temperature of 600° C. Compared with soda-lime glass, borosilicate glass has a higher transparency which improves current collection, a better matched thermal expansion coefficient to CdTe and fewer impurities which may adversely affect the electrical properties of solar cells.

In fabricating the photovoltaic device illustrated in FIG. 1, the front contact 23 formed of a TCO material is first deposited onto the glass substrate 21 by physical vapor deposition (PVD) or chemical vapor deposition (CVD). The TCO of the front contact 23 collects light generated charge carriers while permitting sunlight to pass therethrough. The thickness of the TCO is thus a trade-off between high optical transparency and low sheet resistance. The TCO layer is normally doped to decrease the sheet resistance and is thick enough to form a barrier against diffusion of unwanted species from the glass substrate 21 during operation and high temperature fabrication process. The most commonly used front contact material for CdTe solar cells is fluorine doped tin oxide ($SnO_2$:F) because soda-lime glass pre-coated with $SnO_2$:F is readily available from commercial glass suppliers. The sheet resistance of $SnO_2$:F is sufficiently low enough so as not to hinder the solar cell performance. However, $SnO_2$:F has a relatively low optical transmission coefficient of approximately 80%, which limits the short circuit current ($J_{sc}$) of the solar cell. Alternative TCO materials such as cadmium stannate ($CdSnO_4$) have also been employed for the front contact 23 to overcome the low optical transmission problem associated with $SnO_2$:F.

An optional secondary TCO layer (not shown) with higher sheet resistance than that of the TCO layer used for the front contact 23 may be interposed between the window layer 25 and the front contact 23. This secondary TCO layer formed on the front contact is known as high-resistance TCO (HRT). Undoped zinc stannate ($ZnSnO_4$), zinc oxide (ZnO) and $SnO_2$ have been employed as the HRT layer which permits thinning of the CdS window layer 25, thereby increasing the quantum efficiency of the solar cell in the blue region. The HRT layer may also improve the solar cell efficiency by forming a barrier against diffusion of unwanted species from the glass substrate 21 and the front contact 23 to the CdS window layer 25.

Following the deposition of the front contact 23 onto the glass substrate 21 of the photovoltaic device illustrated in FIG. 1, a first mechanical or laser scribing step is applied over the entire width of the substrate 21 to pattern the front contact 23 and to isolate individual cells. The cuts have to be as narrow as possible (100 μm range) and are spaced apart by 5-10 mm.

After scribing the front contact layer 23, the n-type CdS window layer 25 having a thickness of 80-300 nm is deposited onto the front contact layer 23 by various methods including sputter deposition, chemical bath deposition and close spaced sublimation (CSS). Since CdS has a band gap energy of approximately 2.4 eV, high energy (blue) photons may be absorbed by the CdS window layer 25 before reaching the CdTe absorber layer 27. Photons absorbed by the CdS window layer 25 do not contribute to the current generation of the device. Consequently, the thickness of the CdS window layer 25 should be as thin as possible to minimize this loss. The thinning of the CdS window layer 25, however, may lead to pin-hole formation which may cause a shunt between the front contact 23 and the CdTe absorber layer 27. This is further complicated by the fact that some CdS is consumed during the subsequent CdTe deposition and post-deposition annealing.

According to the device illustrated in FIG. 1, the p-type CdTe absorber layer 27 having a thickness of 2-8 µm is then deposited onto the n-type CdS window layer 25, thereby forming a heterogeneous p-n junction. There has been a trend to minimize the thickness of the CdTe absorber layer 27 in order to conserve the rare element tellurium (Te), because it is thought that there may not be adequate Te supply to fabricate enough CdTe photovoltaic devices to meet global demand. Cadmium telluride has a direct band gap energy of 1.45-1.5 eV, which is well suited for the terrestrial solar spectrum for a single junction solar cell. Moreover, the direct band gap structure gives CdTe a high optical absorption coefficient of $5 \times 10^4$ cm$^{-1}$ in visible light spectrum. One micrometer of CdTe can absorb 92% of incident sunlight.

There are a multitude of methods for depositing the CdS window layer 25 and the CdTe absorber layer 27. U.S. Pat. No. 4,095,006 to Jordan et al. describes a method for forming a CdS semiconductor layer from a solution comprising a cadmium salt and a sulfur containing compound. U.S. Pat. No. 5,393,675 to Compaan discloses a method for depositing CdS and CdTe semiconductor layers by radio frequency (RF) magnetron sputter deposition for a photovoltaic device. While RF magnetron sputter deposition can improve the film quality of CdS and CdTe semiconductor layers and thus increase the cell efficiency, the sputter deposition rate is only 20 to 150 nm per minute (min).

U.S. Pat. No. 5,994,642 to Higuchi et al. describes the method of close spaced sublimation (CSS) which is the conventional method for depositing several micrometers thick CdTe semiconductor layer in the manufacturing of CdTe photovoltaic devices. The CSS process of depositing CdTe generally has a high rate in the range of 5 to 15 µm/min, which is 20 to 50 times higher than other vacuum deposition techniques such as sputter deposition and conventional vacuum evaporation. In the CSS method a substantially flat substrate is positioned in parallel with a CdTe source plate along a plane spaced apart therefrom in a rough vacuum environment. The substrate and the source plate are heated to about 500° C. with the substrate temperature being held at a slightly lower temperature, which drives the condensation of CdTe vapor on the substrate surface and thus CdTe film formation on the same.

After the deposition of the CdTe absorber layer 27, a layer of cadmium chloride ($CdCl_2$) is deposited onto the surface thereof, which is then followed by a 20 to 30 minute annealing at about 450° C. in air. The $CdCl_2$ may be deposited using a vacuum deposition technique or a colloidal solution containing a mixture of $CdCl_2$ particles and methanol. The need for the $CdCl_2$ treatment arises from the difficulties in doping CdTe with high concentrations of foreign dopants because of the ability of native defects in CdTe to form complexes which can act as doping centers themselves and potentially compensate for the impurity doping. While the precise mechanisms of $CdCl_2$ treatment are still not fully clear, it is generally believed that a chlorine (Cl) atom from $CdCl_2$ substituting a Te atom acts as a shallow donor, thereby increasing p-type doping of CdTe.

Following the $CdCl_2$ treatment, a second mechanical or laser scribing step is applied over the entire width of the substrate 21 to thereby pattern the interconnect between adjacent cells of the photovoltaic device illustrated in FIG. 1. The cuts stop on the front contact 23 and are spaced apart by 5-10 mm depending on the design.

After the second scribing step to pattern the interconnect between adjacent cells, a layer of back contact 29 is deposited onto the CdTe absorber layer 27. In order to establish a low resistive ohmic contact with the p-type CdTe semiconductor, the work function of the metallic contact material needs to exceed that of the semiconductor. However, the p-type CdTe has an extremely high work function of 5.8 eV owing to high electron affinity thereof, which essentially prevents the formation of a low resistive CdTe/metal contact for all known metals. If the work function of the contact does not exceed that of the p-type CdTe, a Schottky barrier would form at the interface which would hinder the carrier movement across the same, thereby decreasing the device efficiency.

There are several schemes developed to minimize the contact barrier at the interface between the back contact 29 and the CdTe absorber layer 27. The implementation of these schemes is the primary reason for fabrication CdTe photovoltaic device in the "superstrate" configuration. One approach to overcome the above mentioned problem is to minimize the width of the barrier by increasing the dopant concentration of CdTe at the contact/CdTe interface, thereby permitting carriers to tunnel therethrough. The dopant concentration may be increased by selectively etching Cd to form a Te-rich surface. Another approach is to form a thin, intermediate layer such as copper telluride ($Cu_xTe$) and copper doped zinc telluride (ZnTe:Cu) in between the contact and CdTe. As such, the deposition of the back contact 29 is often implemented as a bilayer system: a thin layer of copper is first deposited onto the CdTe surface to form copper telluride and then followed by the deposition of a thicker conductive material such as gold, titanium or graphite-silver paste.

Following the deposition of the back contact 29, a third mechanical or laser scribing step is applied over the entire width of the substrate 21 to pattern the back contact 29, thereby completing the photovoltaic device illustrated in FIG. 1.

Much of the development effort in improving CdTe solar cell efficiency heretofore has been focused on the $CdCl_2$ treatment and the back contact schemes described above. While the band gap energy of CdTe is considered to be nearly ideal for a solar cell with a single absorber layer, CdTe does not absorb photons with energies less than its band gap energy of 1.45 eV. Unlike crystalline silicon and copper indium gallium selenide (CIGS) photovoltaic devices which have lower band gap energies of about 1.1 eV to 1.2 eV and higher conversion efficiencies, CdTe photovoltaic device cannot effectively convert the red and near infrared part of the sunlight into electrical energy.

The conventional technique for the production of CdTe thin film photovoltaic devices is the "batch" type process which is inherently slow compared with the continuous deposition process where the substrate is continuously conveyed during processing. The use of the batch process for manufacturing of CdTe photovoltaic devices is partly due to the deposition of relatively thick CdTe semiconductor layer by CSS which is performed with a stationary substrate in a sealed chamber. While the CSS process generally has a higher deposition rate compared with other vacuum deposition methods such as sputter deposition and conventional vacuum evaporation, the use of the CSS process precludes the integration thereof into a continuous deposition scheme to thereby improve throughput. Moreover, increasing the substrate size can cause problems in maintaining planarity in the CSS process because the heated stationary substrate which is supported at only its periphery tends to sag at the center.

SUMMARY OF THE INVENTION

The present invention addresses the drawbacks of the prior art "batch" type of process noted above and provides an improved continuous deposition apparatus and process for manufacturing CdTe photovoltaic devices, including devices having multiple absorber layers which absorb photons from the red and near infrared part of the solar spectrum to thereby improve conversion efficiency.

Accordingly, an object of the present invention is to provide a novel vapor deposition apparatus and process which has a comparable CdTe deposition rate as the CSS process and can be integrated into a continuous deposition scheme for high throughput manufacturing of CdTe photovoltaic devices.

Another object of the present invention is to provide an improved apparatus and process for continuous deposition of the widow and absorber semiconductor layers for CdTe photovoltaic devices at a relatively fast rate.

Yet another object of the present invention is to provide an improved apparatus and process for continuous deposition of the window and absorber semiconductor layers incorporating chlorine or iodine dopant therein for CdTe photovoltaic devices at a relatively fast rate.

Therefore, according to one aspect of the present invention, a method for fabricating a heterojunction photovoltaic device including three p-type absorber layers in contiguous contact, each of the three absorber layers having a different composition and containing cadmium as a principal constituent, the method comprises the steps of providing an optically transparent substrate coated with a transparent conductive oxide layer thereon; depositing an n-type window layer formed of CdS or CdZnS onto the transparent conductive oxide layer by sputter deposition; depositing a first p-type absorber layer onto the window layer by sputter deposition; depositing a second p-type absorber layer formed on CdTe onto the first absorber layer; depositing a third p-type absorber layer formed of CdHgTe onto the second absorber layer by sputter deposition; depositing a $CdCl_2$ layer onto the third absorber layer; and annealing the $CdCl_2$ layer and the absorber layers at a temperature in the range of from about 380° C. to about 450° C. to drive the chlorine from the $CdCl_2$ layer into the absorber layers, thereby forming chlorine doped absorber layers. The substrate is continuously conveyed in the successive processing steps without being exposed to the atmospheric environment.

According to the above invention, the deposition of the second p-type CdTe absorber layer onto the first absorber layer comprises the steps of heating a container and a solid CdTe source material therein to a temperature sufficiently high to thereby create a CdTe vapor; introducing a heated carrier gas into the container to entrain the CdTe vapor in the heated carrier gas; flowing the CdTe vapor entrained in the heated carrier gas through a heated baffle and to a heated conduit connected to a heated processing chamber with the baffle, the conduit and the processing chamber being heated to temperatures sufficiently high to prevent the condensation of the CdTe vapor onto the surface thereof; heating the substrate to a temperature below the temperatures of the baffle, the conduit and the processing chamber; and conveying the substrate on a path near the exit of the heated conduit to receive the CdTe vapor with the distance between the substrate surface and the heated conduit being controlled to be in the range of from 1 mm to 20 mm, thereby forming a CdTe film on the substrate surface facing the heated conduit.

According to another aspect of the present invention, a method for fabricating a heterojunction photovoltaic device including three p-type absorber layers in contiguous contact with each of the three absorber layers having a different composition and containing cadmium as a principal constituent, the method comprises the steps of providing an optically transparent substrate coated with a transparent conductive oxide layer thereon; depositing an n-type window layer doped with chlorine onto the transparent conductive oxide layer by sputter deposition; depositing a first p-type absorber layer doped with chlorine onto the window layer by sputter deposition; depositing a second p-type absorber layer doped with chlorine or iodine onto the first absorber layer; and depositing a third p-type absorber layer doped with chlorine onto the second absorber layer by sputter deposition. The n-type window layer is CdS:Cl or CdZnS:Cl. The second p-type absorber layer is CdTe:Cl or CdTe:I. The third p-type absorber layer is CdHgTe:Cl. The substrate is continuously conveyed in the successive processing steps without being exposed to the atmospheric environment.

According to the above invention, the deposition of the second p-type CdTe absorber layer doped with iodine onto the first absorber layer comprises the steps of heating a first container and a solid CdTe source material therein to a temperature sufficiently high to thereby create a CdTe vapor; heating a second container and a solid $CdI_2$ source material therein to a temperature sufficiently high to thereby create a $CdI_2$ vapor; introducing a first heated carrier gas into the first container to entrain the CdTe vapor in the first heated carrier gas; introducing a second heated carrier gas into the second container to entrain the $CdI_2$ vapor in the second heated carrier gas; flowing the CdTe vapor entrained in the first heated carrier gas and the $CdI_2$ vapor entrained in the second heated carrier gas into a heated baffle, thereby forming a vapor mixture of CdTe and $CdI_2$ entrained in a carrier gas mixture of the first heated carrier gas and the second heated carrier gas; flowing the vapor mixture entrained in the heated carrier gas mixture from the heated baffle into a heated processing chamber through a heated conduit with the baffle, the conduit and the processing chamber being heated to temperatures sufficiently high to prevent the condensation of the CdTe vapor and the $CdI_2$ vapor onto the surface thereof; heating the substrate to a temperature below the temperatures of the baffle, the conduit and the processing chamber; and conveying the substrate on a path near the exit of the heated conduit to receive the vapor mixture of CdTe and $CdI_2$ with the distance between the substrate surface and the exit of the heated conduit being controlled to be in the range of from 1 mm to 20 mm, thereby forming a CdTe:I film on the substrate surface facing the heated conduit.

According to yet another aspect of the present invention, a method for fabricating a heterojunction photovoltaic device comprises the steps of providing an optically transparent substrate coated with a transparent conductive oxide layer thereon; depositing an n-type window layer onto the transparent conductive oxide layer by sputter deposition; depositing a p-type CdTe absorber layer doped with chlorine or iodine onto the window layer; and annealing the absorber layer by a plurality of rapid thermal anneal (RTA) lamps at a temperature in the range of from about 450° C. to about 600° C. to thereby increase the grain size of the absorber layer. The n-type window layer is formed of an n-type semiconductor selected from the group consisting of CdS, CdS:Cl, $Cd_{1-x}Zn_xS$ and $Cd_{1-x}Zn_xS$:Cl, where x ranges from more than zero to no more than one. The p-type absorber layer is formed of CdTe:Cl or CdTe:I. The substrate is continuously conveyed in the successive processing steps without being exposed to the atmospheric environment.

To achieve the above and other objects, according to still another aspect of the present invention, a modular deposition apparatus for depositing semiconductor compounds containing tellurium or sulfur as a principal constituent on substrates to form photovoltaic devices as the substrates are continuously conveyed through the deposition apparatus is provided. The apparatus comprises a plurality of processing stations connected in series and a conveyor system for conveying the substrates in the processing stations and therebetween. At least one of the processing stations is a sputter deposition station. At least one of the processing stations is a vapor deposition station. The vapor deposition station includes a processing chamber for receiving therein one of the substrates and at least one source material vapor entrained in a carrier gas; at least one vapor deposition source for generating the at least one source material vapor with the at least one vapor deposition source being connected to a baffle, each of the at least one vapor deposition source has a heated container for subliming a solid source material therein to thereby generate one of the at least one source material vapor; a conduit connected to the baffle for directing the at least one source material vapor entrained in the carrier gas onto the substrate surface, thereby forming a film thereon; and a means for heating the processing chamber, the at least one vapor deposition source, the baffle and the conduit to a temperature sufficiently high so as to prevent the condensation of the at least one source material vapor onto the surface thereof.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures.

DETAILED DESCRIPTION OF THE INVENTION

The present invention overcomes the inability of the conventional CdTe photovoltaic device to absorb low energy photons by the spectrum splitting or multi band gap approach, wherein multiple absorber layers with different band gap energies are employed to absorb photons from a wider range of the solar spectrum. Compared with the conventional CdTe absorber having a band gap energy of 1.45-1.5 eV, an absorber layer with a higher band gap energy can convert high energy photons to higher open circuit voltage ($V_{oc}$), while an absorber with a lower band gap energy can absorb lower energy photons and allow more efficient use of the solar spectrum.

Figure 2:
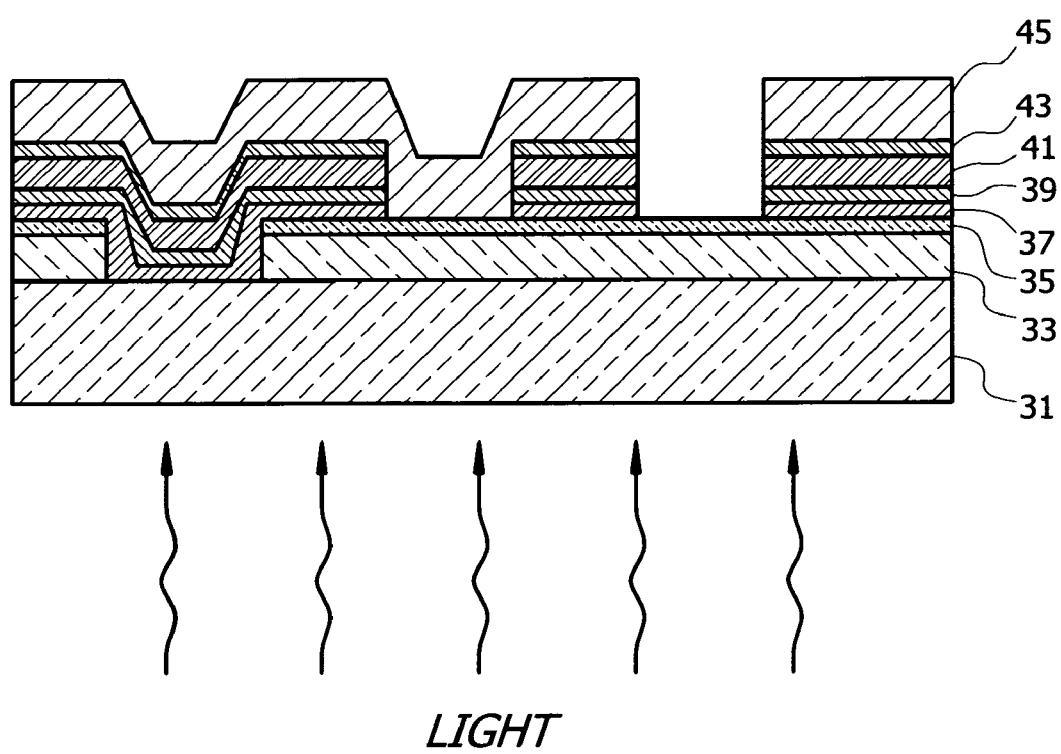
FIG. 2 is a cross sectional schematic view of a photovoltaic device according to the present invention.

The preferred embodiment of the present invention as applied to a CdTe photovoltaic device having three absorber layers will now be described with reference to FIG. 2. Referring now to FIG. 2, the illustrated device has an optically transparent dielectric substrate 31, through which radiant energy or sunlight enters the device; a layer of optically transparent front contact 33 formed of a TCO material disposed on the substrate 31 for collecting light generated charge carriers; a layer of secondary TCO layer 35 having higher electrical resistivity disposed on the front contact 33; an n-type cadmium sulfide (CdS) or cadmium zinc sulfide (CdZnS) window layer 37 disposed on the secondary TCO layer 35; a p-type first absorber layer 39 having a high band gap energy in the range of 1.7 eV to 1.8 eV disposed on the window layer 37, thereby forming a rectifying junction therebetween; a p-type CdTe second absorber layer 41 having an intermediate band gap energy in the range of 1.4 eV to 1.5 eV disposed on the first absorber layer 39; a p-type third absorber layer 43 having a low band gap energy in the range of 1.0 eV to 1.2 eV disposed on the second absorber layer 41; and a back contact 45 disposed on the third absorber layer 43 for collecting light generated charge carriers.

The device illustrated in FIG. 2 is constructed in the "superstrate" configuration, wherein the substrate 31 acts as the input window for receiving sunlight and provides support for the device layers 33-45 during fabrication and operation. The transparent dielectric substrate 31, preferably made of soda-lime or borosilicate glass, also provides protection for the device from impact and elements while allowing maximum transmission of sunlight.

The function of the front contact 33 is to collect light generated charge carriers while allowing sunlight to pass therethrough. As such, the front contact 33 is preferably a doped TCO material such as fluorine doped tin oxide ($SnO_2$:F) and aluminum doped zinc oxide (ZnO:Al), and is sputter deposited onto the substrate 31. The thickness of the front contact 33 is between 0.5 μm and 2 μm, depending on the sheet resistance and transmission requirements.

The secondary TCO layer 35, also known as high-resistance TCO (HRT), is formed of undoped zinc stannate ($ZnSnO_4$), zinc oxide (ZnO) or $SnO_2$ and can be deposited onto the front contact 33 by various methods including sputter deposition, conventional vacuum evaporation and chemical vapor deposition (CVD). The use of HRT layer permits thinning of the window layer 37, thereby increasing the quantum efficiency of the photovoltaic device in the blue part of the solar spectrum. The preferred thickness of the secondary TCO layer 35 ranges from about 50 nm to about 150 nm.

An appropriate material for the n-type window layer 37 of the device illustrated in FIG. 2 is CdS which has a band gap energy of 2.4 eV. Cadmium sulfide may be deposited by various methods including sputter deposition, chemical bath deposition and conventional vacuum evaporation. Photons with energy greater than the band gap energy of CdS (2.4 eV) may be absorbed by CdS before reaching the absorber layers 39-43. Since these photons absorbed by the CdS window layer 37 do not generate charge carriers, it is desirable that the CdS thickness be as thin as possible to minimize this absorption loss. However, the thinning of the CdS window layer 25 can lead to pin-hole formation which may cause a shunt between the front contact 33 and the first absorber layer 39. This is further complicated by the fact that some CdS is consumed during the subsequent absorber deposition and post-deposition annealing. Moreover, a charge depletion region is formed at the heterogeneous junction of the n-type CdS and the p-type absorber, which may extend all the way through the window layer 37 if CdS is very thin or not too heavily doped. Therefore, there is a tradeoff between absorption loss and depletion loss in optimizing the CdS thickness. The preferred thickness for the CdS window layer 37 ranges from about 80 nm to about 300 nm.

Another suitable material for the n-type window layer 37 of the device in FIG. 2 according to the present invention is $Cd_{1-x}Zn_xS$, where x ranges from more than zero to no more than one. Inclusion of zinc in place of some of the cadmium can advantageously increase the band gap energy. Since a semiconductor does not absorb photons with lesser energy than the band gap energy thereof, the use $Cd_{1-x}Zn_xS$ with higher band gap energies for the window layer 37 permits more photons pass therethrough, thereby decreasing the absorption loss. It is thus desired that the band gap energy of the $Cd_{1-x}Zn_xS$ window is 2.4 eV or more. An appropriate thickness of $Cd_{1-x}Zn_xS$ ranges from about 80 nm to about 300 nm. The preferred method of depositing the n-type window layer 37 formed of CdS or $Cd_{1-x}Zn_xS$ according to the present invention is by sputter deposition at a substrate temperature in the range of 200° C. to 450° C.

The crystallinity or grain size of the n-type window layer 37, especially for a layer deposited at a lower temperature, may be increased by the chlorine treatment which comprises the steps of depositing a layer of $CdCl_2$ onto the window layer 37 and subsequent annealing at about 415° C. in air for 20 to 30 min. The annealing process drives or diffuses the chlorine in $CdCl_2$ into the window layer 37, thereby forming a chlorine doped window layer having improved crystallinity. The $CdCl_2$ may be deposited by vacuum deposition methods such as sputter deposition and conventional vacuum evaporation.

The desired multi band gap approach in accordance with the present invention is achieved in the three layer p-type absorber structure with each absorber layer having a different composition. The three p-type absorber layers 39-43 are in contiguous contact and are disposed in series optically as incident light enters the first absorber layer 39 and passes therethrough to enter the second absorber layer 41, etc., until it has passed through all three layers 39-43 or is entirely absorbed. The first absorber layer 39, i.e. the layer that first receives incident light, has a band gap energy higher than 1.5 eV, preferably 1.7 eV to 1.8 eV, for absorbing photons with higher energies. The second absorber layer 41 which is the thickest of the three absorber layers 39-43 and absorbs most of the incident light has a narrower band gap energy in the range of 1.4 eV to 1.5 eV. The third absorber layer 43 has the narrowest band gap energy in the range of about 1.0 eV to about 1.2 eV for absorbing light from the red and near infrared part of the solar spectrum, thereby permitting more efficient use of the solar spectrum.

An appropriate material for the p-type first absorber layer 39 with a relatively higher band gap energy is cadmium magnesium telluride, $Cd_{1-y}Mg_yTe$, where y ranges from more than zero to less than one, preferably from 0.05 to 0.20. Substitution of magnesium for some of the cadmium atoms increases the band gap energy of $Cd_{1-y}Mg_yTe$ to more than 1.5 eV for the CdTe binary compound. Therefore, the preferred band gap energy of 1.7 eV to 1.8 eV for the first absorber layer 39 can be attained by substituting magnesium for 5 to 20% of the cadmium atoms in the film. Manganese (Mn) and zinc (Zn) may also replace some of the cadmium atoms of cadmium telluride to increase the band gap energy to the desired level. As such, $Cd_{1-z}Mn_zTe$ and $Cd_{1-z}Zn_zTe$, where z ranges from zero to less than one, preferably from 0.05 to 0.20, may also be employed for the first absorber layer 39. Another suitable material for the first absorber layer 39 is cadmium selenide (CdSe) which has a band gap energy of 1.7 eV. The preferred thickness of the first absorber layer 39 is in the range of about 5 nm to 200 nm. Various methods may be used to deposit the first absorber layer 39 including sputter deposition and conventional vacuum evaporation. The preferred method of depositing $Cd_{1-y}Mg_yTe$, $Cd_{1-z}Mn_zTe$, $Cd_{1-x}Zn_zTe$ and CdSe in accordance with the present invention is by pulsed DC magnetron sputtering or RF magnetron sputtering, wherein the substrate is preferably heated to a temperature in the range of 200° C. to 450° C. during the sputter deposition process.

The second absorber layer 41 is formed of p-type CdTe which has a band gap energy of about 1.45 eV to 1.5 eV. Most of the incident sunlight is absorbed by the second absorber layer 41 which has a preferred thickness of about 2 to 6 μm. While the CdTe absorber can be deposited by a multitude of methods including CSS, sputter deposition and chemical bath deposition, the preferred deposition method in accordance with the present invention is a novel vapor deposition process which utilizes sublimed CdTe vapor to form the CdTe film. The novel vapor deposition process and the apparatus for practicing the same are hereinafter more fully described.

The third p-type absorber layer 43 is formed of cadmium mercury telluride, $Cd_{1-h}Hg_hTe$, where h ranges from more than zero to less than one, preferably from 0.15 to 0.20. Substitution of mercury for some of the cadmium atoms decreases the band gap energy of $Cd_{1-h}Hg_hTe$ to less than 1.5 eV for the CdTe binary compound. Therefore, the preferred band gap energy of 1.0 eV to 1.2 eV for the third absorber layer 43 can be attained by substituting mercury for 15 to 20% of the cadmium atoms in the film. The $Cd_{1-h}Hg_hTe$ absorber layer 43 has a preferred thickness of about 5 nm to 200 nm and can be deposited by sputter deposition at a substrate temperature in the range of 200 to 450° C.

The p-type dopant concentrations and grain sizes of the absorber layers 39-43 may be increased by the chlorine treatment which comprises the steps of depositing a layer of cadmium chloride ($CdCl_2$) onto the third absorber layer 43 and subsequent annealing at about 415° C. in air for a period in the range of 20 to 30 min. The annealing process drives the chlorine from $CdCl_2$ into the absorber layers 39-43, thereby doping the same with chlorine. The $CdCl_2$ may be deposited by vacuum deposition methods such as sputter deposition and conventional vacuum evaporation. The p-type dopant concentrations and the grain sizes of the absorber layers 39-43 may also be increased by doping the same with iodine. The iodine treatment process can be carried out by first depositing a layer of cadmium iodide ($CdI_2$) onto the third absorber layer 43 by sputter deposition or conventional vacuum evaporation and then annealing at a temperature in the range of 400° C. to 600° C. to thereby drive iodine from $CdI_2$ into the absorber layers 39-43.

The back contact 45 has a bilayer structure, wherein the first layer disposed in contiguous contact with the third absorber layer 43 is copper and the second layer is nickel or gold. The copper in contact with $Cd_{1-h}Hg_hTe$ absorber 43 diffuses therein upon subsequent annealing at about 100 to 250° C. and replaces some of the Cd or Hg atoms in $Cd_{1-h}Hg_hTe$, thereby increasing p-type dopant concentration and thus decreasing the contact resistance. However, copper is prone to diffuse across the entire absorber layers 39-43 and to cause shorting if excess amount of copper is deposited. Therefore, the thickness of the copper layer is such that just enough copper is present to diffuse into the top surface of the absorber for establishing a low resistance contact. The copper layer thickness should not exceed about 7 nm. Preferably, the copper layer thickness is about 0.5 nm to 5 nm. The copper layer of the back contact 45 may be deposited onto the third absorber layer 43 by magnetron sputtering or conventional vacuum evaporation. The second layer of the back contact 45 made of gold or nickel, which serves as the main current collector, has a thickness of more than 0.1 µm and may be deposited onto the first copper layer by magnetron sputtering or conventional vacuum evaporation.

Another appropriate bilayer structure for the back contact 45 comprises a first layer formed of copper doped zinc telluride (ZnTe:Cu) and a second layer formed of titanium (Ti), wherein the first ZnTe:Cu layer is in contiguous contact with the third absorber layer 43.

It should be noted that the present invention can also be advantageously applied to a photovoltaic device having two or more absorber layers in contiguous contact. A photovoltaic device including two contiguous absorber layers, for example, may have band gap energies of 1.7 eV and 1.1 eV for the first and second absorber layers, respectively. Similarly, a photovoltaic device including four contiguous absorber layers may have band gap energies of 1.8 eV, 1.5 eV, 1.2 eV and 1.0 eV for the first, second, third and fourth absorber layers, respectively.

Fabrication of the illustrated photovoltaic device of FIG. 2 will now be described. The processing starts by depositing a doped TCO layer for the front contact 33 onto the substrate 31 by sputter deposition or chemical vapor deposition. A thin secondary TCO layer 35 formed of an undoped TCO material is deposited onto the front contact 33. A first scribing step is applied over the entire width of the substrate 31 to pattern the front contact circuit and to isolate individual cells by laser or a mechanical means as well known to one of skill in the art. The scribing cuts have to be as narrow as possible, i.e. 100 µm range, and are spaced apart by 5 to 10 mm. The n-type window layer 37 formed of CdS or $Cd_{1-x}Zn_xS$ is then deposited onto the secondary TCO layer 35 by magnetron sputtering at a temperature in the range of 200° C. to 450° C. The first p-type absorber layer 39 is deposited onto the n-type window layer 37 by sputter deposition at a temperature in the range of 200° C. to 450° C., thereby forming a rectifying junction therebetween. The second p-type absorber layer 41 formed of CdTe is deposited onto the first absorber layer 39 by a physical vapor deposition method in which the CdTe vapor for forming the CdTe film is generated by sublimation of a solid CdTe source. The third p-type $Cd_{1-h}Hg_hTe$ absorber layer 43 is deposited onto the second CdTe absorber layer 41 by sputter deposition at a temperature in the range of 200° C. to 450° C. A thin layer of $CdCl_2$ is sputter deposited onto the surface of the third absorber layer 43 and is annealed at about 415° C. to diffuse or drive chlorine from $CdCl_2$ film into the absorber layers 39-43, thereby increasing p-type doping and crystal grain sizes thereof. A second scribing step which cuts through the absorber layers 39-43 and the window layer 37 is then applied over the entire width of the substrate 31 to pattern the interconnect between adjacent cells by laser or a mechanical means as well known to one of skill in the art. The forming of the back contact 45 on the third absorber layer 43 comprises the steps of depositing a thin layer of copper and a layer of nickel or gold sequentially and annealing the copper/nickel or copper/gold at a temperature in the range of from 100 to 250° C. to diffuse copper into the absorber 43, thereby increasing the p-type doping thereof. A third scribing step, which cuts through the back contact 45, the absorber layers 39-43 and the window layer 37, is then applied over the entire width of the substrate 31 to pattern the back contact circuit and to isolate adjacent cells by laser or a mechanical means. After the steps described above, the device of FIG. 2 is subjected to the final backend processing of cell encapsulation and module packaging.

Figure 3:
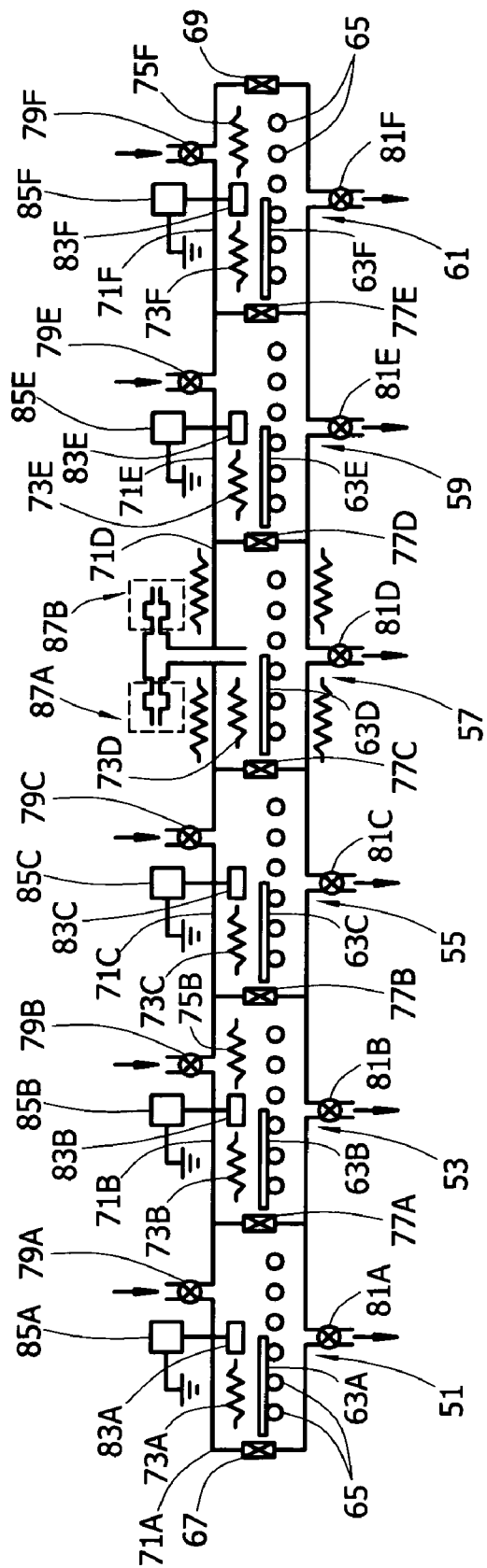
FIG. 3 is a cross sectional schematic view of a modular continuous deposition apparatus having six processing stations in accordance with the present invention.

In a preferred embodiment the window layer 37 and the absorber layers 39-43 of the photovoltaic device in FIG. 2 are deposited by a modular continuous deposition apparatus illustrated in FIG. 3. Referring now to FIG. 3, the illustrated apparatus has a plurality of processing stations 51-61 connected in series and is operable to deposit successive layers of semiconductor films onto each of the substrates 63A-63F which are continuously conveyed by a system of roller conveyor 65 through the apparatus from an entrance valve 67 to an exit valve 69 disposed thereon. The modular continuous deposition apparatus may also have load lock stations (not shown) attached thereto at the two terminating stations 51 and 61, thereby preventing the exposure of the environment therein to atmospheric environment during normal operation. The modular processing stations 51-61 include respective processing chambers 71A-71F constructed of a suitably strong material such as stainless steel and substrate heaters 73A-73F disposed therein to provide substrate heating for film deposition. Additional annealing heaters 75B and 75F disposed in the chambers 71B and 71F, respectively, provide post-deposition annealing of thin film in respective stations. The environment within each of the chambers 71A-71F is isolated from the adjacent chamber environments by a set of isolation valves 77A-77E which open to permit the substrates 63A-63E to pass therethrough after the completion of the respective deposition processes.

Referring again to FIG. 3, the stations 51-55 and 59-61 are used to deposit thinner semiconductor layers, i.e. the window layer 37, the first absorber layer 39 and the third absorber layers 43 of FIG. 2, by sputter deposition and the station 57 deposit the thicker CdTe main absorber layer 41 by a novel vapor deposition method which is hereinafter more fully described. The sputter deposition chambers 71A-71C and 71E-71F include inlet valves 79A-79C and 79E-79F, respectively, for introducing sputter gases and outlet valves 81A-81C and 81E-81F, respectively, for discharging the same. The sputter gases may comprise an inert constituent, such as argon (Ar) or krypton (Kr) for sputtering of the target material, and one or more reactive constituents, such as oxygen, nitrogen and chlorine which are incorporated into sputter deposited films. The sputter deposition chambers 71A-71C and 71E-71F also incorporate therein respective sputter sources 83A-83C and 83E-83F which are electrically connected to power sources 85A-85C and 85E-85F, respectively. The sputter sources 83A-83C and 83E-83F include respective magnetron sputter guns and targets mounted thereon for sputter operation. The sputter targets may be made of n-type CdS, n-type $Cd_{1-x}Zn_xS$, p-type CdSe, p-type CdTe and compounds comprising cadmium and tellurium as principal constituents and can be fabricated by sintering of respective compound powders. Each target can also include dopants such as oxygen and chlorine, which can be directly added to the powder prior to sintering or are incorporated into the target in the subsequent sintering process. The sputter deposition from a doped target results in a doped film having a composition which is substantially the same as the target composition. Each of the power sources 85A-85C and 85E-85F includes a direct current (DC) power supply, a pulsed DC power supply having a modulation frequency in the range of 1 to 40 kHz or a radio frequency (RF) power supply with an excitation frequency of 13.56 MHz, depending on the electrical conductivity of the target powered thereby. The pulsed DC power supply and the RF power supply are preferred for the sputter deposition of semiconductor materials such as CdS and CdTe.

Operation of the sputter deposition stations 51-55 and 59-61 will now be described with continuing reference to FIG. 3. The sputter deposition chambers 71A-71C and 71E-

71F are first evacuated by pumping via the outlet valves 81A-81C and 81E-81F, respectively, to reach a desired pressure level. The entrance valve 67 and the isolation valves 77A-77E are then open to respectively permit the substrates 63A-63C and 63E-63F continuously conveyed by the roller conveyor 65 to pass therethrough. The continuously conveying substrates 63A-63C and 63E-63F pass by the substrate heaters 73A-73C and 73E-73F, respectively, and are heated to desired temperatures thereby. The entrance valve 67 and the isolation valves 77A-77E are closed again after the substrates 63A-63C and 63E-63F, respectively, have completely pass therethrough, thereby sealing the substrates 63A-63C and 63E-63F in individual processing environments. Thereafter, individual sputter gases are introduced into the sputter deposition chambers 71A-71C and 71E-71F via the inlet valves 79A-79C and 79E-79F, respectively, so as to establish individual sputter gas environments having pressures in the range of $5 \times 10^{-3}$ to $5 \times 10^{-2}$ Torr. As power is supplied to the sputter guns of the sputter sources 83A-83C and 83E-83F by the power sources 85A-85C and 85E-85F, respectively, a gaseous plasma is formed in the proximity of the target surface by ionization of the sputter gas in each of the sputter deposition chambers 71A-71C and 71E-71F. Positively charged ions in the plasma, attracted by the negative potential of the target, impinge upon the target surface and cause backward sputtering of target atoms onto the substrate surface, thereby forming a film thereon. In the sputter deposition chambers 71B and 71F equipped the annealing heaters, the sputter deposited films formed on the substrates 63B and 63F are annealed by the annealing heaters 75B and 75F, respectively, as the conveying substrates 63B and 63F move away from the respective sputter sources 83B and 83F and pass beneath the respective annealing heaters 75B and 75F. The sputter deposition process continues until the conveying substrates 63A-63C and 63E-63F completely pass by the sputter sources 83A-83C and 83E-83F, respectively, after which the power to sputter guns is terminated and inlet valves 79A-79C and 79E-79F for introducing sputter gases are closed. The sputter deposition chambers 71A-71C and 71E-71F are evacuated again and the isolation valves 77A-77C, 77E and 69 open to thereby permit the substrates 63A-63C and 63E-63F, respectively, to be conveyed to next process chambers therethrough. Concurrently, substrates in previous processing chambers are conveyed into the sputter deposition chambers 71A-71C and 71E-71F through the opened entrance valve 67 and isolation valves 77A-77E to begin the next deposition cycle.

Figure 4:
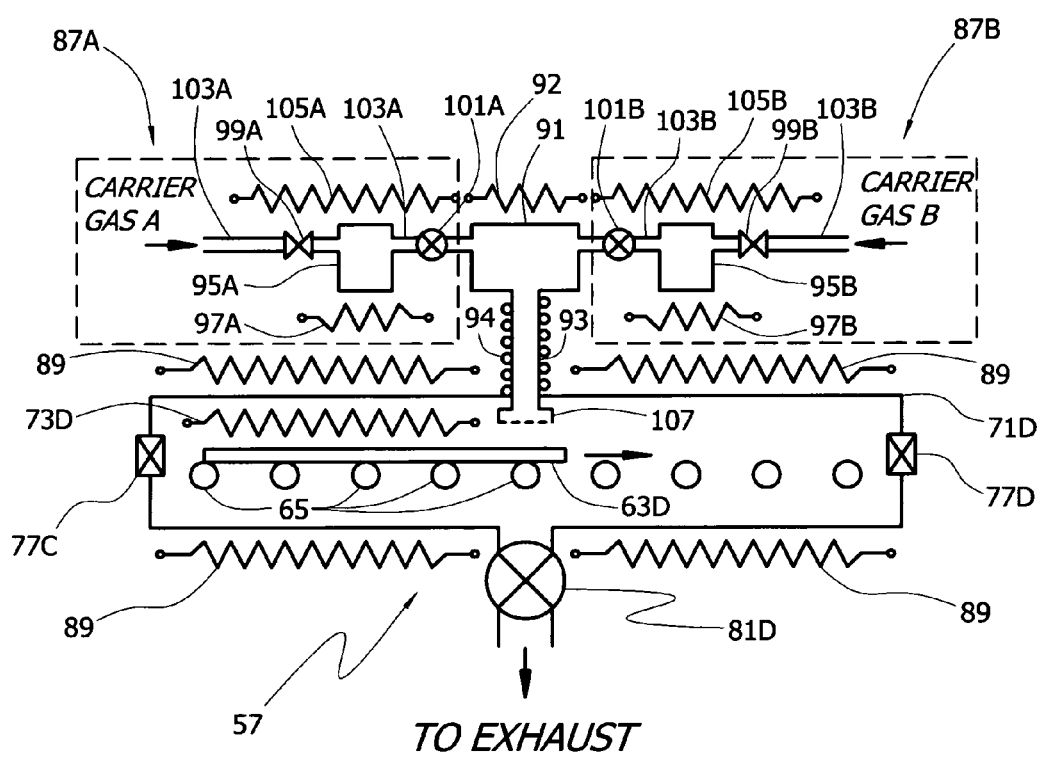
FIG. 4 is a cross sectional schematic view of a vapor deposition station in accordance with the present invention.

The above-mentioned processing station 57 for the vapor deposition of the main CdTe absorber layer is constructed according to FIG. 4, in which numerals 57, 63D, 65, 71D, 73D, 77C, 77D, 81D, 87A and 87B denote the same components or substances as those shown in FIG. 3. Referring now to FIG. 4, the station 57 comprises the processing chamber 71D incorporating therein the substrate heater 73D for heating the substrate 63D conveyed by the roller conveyor 65; a heater system 89 for heating the chamber wall and the chamber environment; the isolation valves 77C and 77D disposed on the chamber 71D for respectively receiving and ejecting the substrate 63D; and a pair of vapor deposition sources 87A and 87B connected to a baffle 91 which is attached to a conduit 93 extending into the chamber 71D. The baffle 91 and the conduit 93 are heated by a baffle heater 92 and a conduit heater 94, respectively. The conduit 93 has a shower head 107 attached thereto for introducing a source material vapor into the process chamber 71D. The shower head 107 has a plurality of holes or openings distributed over the bottom surface thereof, such that the source material vapor passes therethrough is uniformly distributed over the area below the bottom surface thereof. Moreover, the gap distance between the bottom of the shower head 107 and the top of the substrate 63D is critical for controlling the film deposition rate and uniformity. The preferred gap distance is in the range of about 1 mm to 20 mm.

With continuing reference to FIG. 4, the vapor deposition sources 87A and 87B include source material containers 95A and 95B, respectively, for generating deposition vapors by sublimation of source materials therein. The source materials can be cadmium (Cd), tellurium (Te), cadmium sulfide (CdS), cadmium zinc sulfide ($Cd_{1-x}Zn_xS$), cadmium chloride ($CdCl_2$), cadmium iodide ($CdI_2$), CdTe and compounds containing Cd and Te as principal constituents. The source materials in the source material containers 95A and 95B are in the form of solid pellet or powder and are respectively heated by the container heaters 97A and 97B to sublimation temperatures of the source materials. Heated carrier gases A and B are respectively fed through gas valves 99A and 99B and into the heated source material containers 95A and 95B, in which the source material vapors are entrained in the carrier gases A and B. The carrier gases A and B containing the source material vapors are then fed through line valves 101A and 101B, respectively, and into the baffle 91, in which the carrier gases are homogenously mixed prior to flowing into the processing chamber 71D through the conduit 93. The gas valves 99A and 99B, the source material containers 95A and 95B, and the line valves 101A and 101B are respectively connected in series by a pair of delivery lines 103A and 103B. Gases and vapors in the delivery lines 103A and 103B are heated by line heaters 105A and 105B, respectively.

The carrier gases A and B which are usually composed of a relatively inert gas such as argon or nitrogen may also include one or more reactive components such as chlorine and iodine, which are incorporated into the film in the vapor deposition process. The carrier gases A and B are heated to at least 300° C. prior to entering into the source material containers 95A and 95B, respectively, so as to prevent the cooling of the sublimed vapors therein. For source materials such as CdTe, CdS, $CdCl_2$ and the like, the source material containers 95A and 95B are heated by the container heaters 97A and 97B, respectively, to a temperature above about 550° C., preferably above about 650° C., to thereby sublime the source materials therein. The sublimation rate of source materials and hence the film deposition rate increases with increasing source material temperature. Moreover, the inner wall surface of the vapor deposition station 57 including the delivery lines 103A and 103B, the baffle 91, the conduit 93, the shower head 107 and the process chamber 71D, which is exposed to the source material vapors during operation, is heated to at least 500° C. to thereby prevent the condensation of the source vapors thereon. Compared with the inner wall surface of the station 57, the substrate 63D is heated by the substrate heater 73D to a lower temperature of less than about 500° C., preferably in the range of about 450 to 500° C., thereby facilitating the condensation of the source vapors thereon to form a film.

Figure 5:
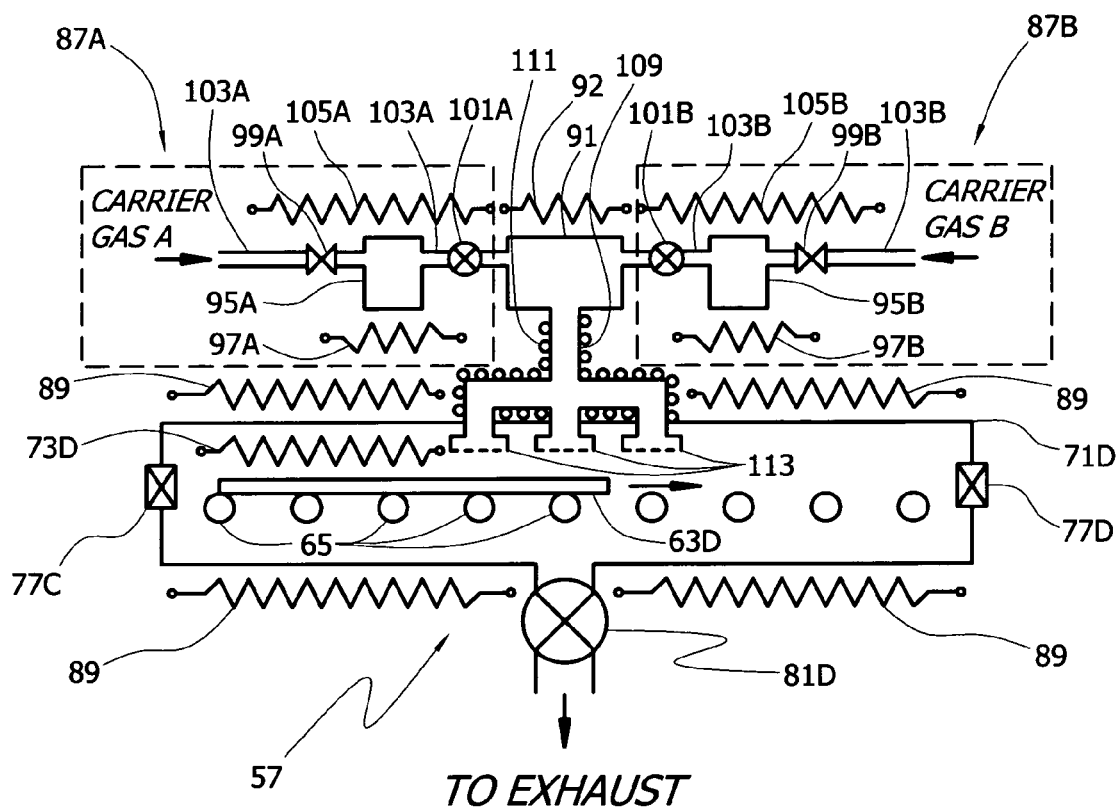
FIG. 5 is a cross sectional schematic view of a vapor deposition station in accordance with another embodiment of the present invention.

It should be appreciated that the vapor deposition station 57 can be modified to have only one vapor deposition source or additional vapor deposition sources connected to the baffle 91, thereby permitting the deposition of compounds and alloys from a plurality of sources having different source materials. For example, p-type CdTe films doped with chlorine and iodine may be deposited using a three-source configuration in which CdTe, $CdCl_2$ and $CdI_2$ source materials are employed. Alternatively, the use of multiple sources having the same source material therein can increase the deposition rate compared with that for the single source. The vapor deposition station 57 may also be modified to incorporate multiple gas inlets into the chamber 71D for the source material vapors to thereby improve the film uniformity as illustrated in FIG. 5, in which numerals 57 to 105 denote the same components or substances as those shown for the station in FIG. 4. The vapor deposition station of FIG. 5 is different from the station of FIG. 4 in that the single inlet conduit 93 and the conduit heater 94 in FIG. 4 are replaced by a modified conduit 109 having three separate gas inlets into the chamber 71D and a modified conduit heater 111. Each of the three gas inlets has a gas shower 113 connected thereto.

Operation of the vapor deposition station 57 with continuing reference to FIG. 4 will now be described. The vapor deposition station 57 is first evacuated by pumping through the outlet valve 81D to reach a pressure in the range of about $10^{-3}$ to $10^{-6}$ Torr. The isolation valve 77C then opens to permit the substrate 63D conveyed by the roller conveyor 65 to pass therethrough. The continuously conveying substrate 63D passes by the substrate heater 73D and is heated to a temperature in the range of about 450 to 500° C. thereby. The isolation valve 77C closes again after the substrate 63D completely passes therethrough, thereby sealing the controlled environment in the process chamber 71D from the rest of the apparatus. The line valves 101A and 101B open to permit the flow of the sublimed source material vapors, i.e. $CdTe$, $CdCl_2$, $CdI_2$ and a mixture thereof, entrained in the heated carrier gases A and B into the chamber 71D as the leading edge of the substrate 63D moves beneath the shower head 107. The source material vapors entrained in the carrier gases flow into the process chamber 71D through the shower head 107 and condense onto the substrate surface to form a film thereon. The chamber pressure is maintained in the range of $10^{-1}$ to 50 Torr during vapor deposition processing. The mean free path of the source material vapors in the chamber 71D is longer at a lower chamber pressure, which results in higher film deposition rates and more vapor travel, thereby leading to some unintended film formation on the bottom surface of the substrate 63D, i.e. the surface in contact with the roller conveyor 65. The processing chamber pressure and the gap distance between the shower head 107 and the substrate surface are important variables for controlling the film deposition rate and the film uniformity during deposition. The vapor deposition process proceeds until the trailing edge of the substrate 63D moves past the shower head 107, after which the line valves 101A and 101B are closed again to stop the flow of the source material vapors into the chamber 71D. Thereafter, the chamber 71D is evacuated again and the isolation valve 77D is opened to permit conveyance of the substrate 63D to the next processing chamber therethrough. Concurrently, the substrate in the previous processing station is conveyed into the process chamber 71D through the opened isolation valve 77C to thereby begin the next deposition cycle.

Fabrication of the window layer 37 and the absorber layers 39-43 of the photovoltaic device in FIG. 2 by the modular continuous deposition apparatus illustrated in FIGS. 3 and 4 will now be described. The processing begins by providing a transparent substrate coated with a layer of TCO material. The substrate coated with TCO is then conveyed into the sputter deposition station 51, in which a layer of an n-type window semiconductor having a thickness in the range of 0.08 to 0.3 μm is sputter deposited onto the TCO on top of the continuously conveying substrate. The n-type window semiconductor is formed of CdS or $Cd_{1-x}Zn_xS$, where x ranges from more than zero to no more than one. The n-type window layer is sputter deposited using a compound target having substantially the same composition as the window layer. The sputter deposition is carried out at a chamber pressure in the range of $5 \times 10^{-3}$ to $10^{-1}$ Torr and a substrate temperature in the range of 250 to 450° C. The sputter deposition rate of the n-type window layer is in the range of 0.05 to 0.15 μm/min.

After the deposition of the window layer in the station 51, the substrate is conveyed into the next sputter deposition station 53, in which a layer of $CdCl_2$ having a thickness in the range of 0.05 to 0.1 μm is sputtered deposited onto the window layer on the continuously conveying substrate. The sputter deposition of $CdCl_2$ in the station 53 is carried out using a $CdCl_2$ target in an argon sputter environment maintained at a pressure in the range of $5 \times 10^{-3}$ to $10^{-1}$ Torr. The substrate is heated by the substrate heater 73B to a temperature in the range of 250 to 450° C. during sputter deposition, after which the sputter deposited $CdCl_2$ film is annealed by the annealing heater 75B at a temperature in the range of 400 to 500° C., thereby driving or diffusing the chlorine in $CdCl_2$ into the window layer so as to improve the crystallinity thereof.

After the deposition of $CdCl_2$ and the subsequent annealing in the station 53, the substrate is conveyed into the next sputter deposition station 55, in which a layer of a first p-type absorber semiconductor having a thickness in the range of 0.08 to 0.3 μm is sputtered deposited onto the $CdCl_2$ deposited substrate surface as the substrate is continuously conveyed by the roller conveyor 65. The first p-type absorber semiconductor layer is selected from the group consisting of $CdSe$, $Cd_{1-y}Mg_yTe$, $Cd_{1-y}Mn_yTe$ and $Cd_{y-1}Zn_yTe$, where y ranges from about 0.05 to about 0.20. The first absorber layer is sputter deposited in an argon environment using a compound target having substantially the same composition as the first absorber layer. The sputter deposition process is carried out in an argon environment having a pressure in the range of $5 \times 10^{-3}$ to $10^{-1}$ Torr and at a substrate temperature in the range of 250 to 450° C.

The processing proceeds as the substrate is conveyed into the vapor deposition station 57, in which a layer of the p-type CdTe main absorber semiconductor having a thickness in the range of 2 to 6 μm is deposited onto the first absorber layer on the continuously conveying substrate. The deposition of the CdTe layer using the vapor deposition station 57 illustrated in FIG. 4 may be accomplished by employing one or both of the vapor deposition sources 87A and 87B. When employing only one vapor deposition source 87A, a solid CdTe compound is the preferred source material and the line valve 101B of the unused vapor deposition source 87B is closed during operation. The CdTe source material in the source container 95A sublimes to form CdTe vapor or Cd and $Te_2$ vapors. The CdTe vapor entrained in the carrier gas A which comprises an inert gas such as argon or nitrogen flows into the chamber 71D through the shower head 107 and condenses onto the substrate to form a CdTe film thereon. The CdTe source material in the source container 95A is heated by the container heater 97A to a temperature above 650° C. so as to attain a high enough sublimation rate which would result in a film deposition rate higher than 1 μm/min. The inner wall surface of the vapor deposition station 57 which is exposed to the CdTe source vapor during operation is heated to at least 500° C. to thereby prevent the condensation of the CdTe vapor thereon. Compared with the surrounding chamber surface, the substrate is heated to a lower temperature, preferably in the range of 450 to 500° C., thereby facilitating the preferential condensation of the CdTe vapor thereon.

As mentioned above, the main CdTe absorber layer may also be deposited by using both of the vapor deposition sources 87A and 87B simultaneously to thereby advantageously increase the CdTe film deposition rate. There are two approaches to carry out this dual-source deposition process. One approach is to use the CdTe compound source material for both sources 87A and 87B. In this approach the vapor deposition sources 87A and 87B operate according to the procedures described above for the single source method. The other approach is to use Cd and Te elemental source materials for the sources 87A and 87B, respectively. In this approach the Cd and Te sublimation rates and hence respective deposition rates may be controlled independently by container heaters 97A and 97B, respectively, to thereby attain desired CdTe film composition.

Referring again to FIG. 3, after the vapor deposition of the CdTe main absorber layer in the station 57, the substrate is conveyed into the sputter deposition station 59, in which a layer of a third p-type absorber semiconductor having a thickness in the range of 0.08 to 0.3 μm is sputtered deposited onto the CdTe layer on the continuously conveying substrate. The third p-type absorber layer is formed of $Cd_{1-h}Hg_hTe$, where h ranges from more than zero to less than one, preferably from 0.15 to 0.20. The third absorber layer is sputter deposited in an argon environment using a compound target having substantially the same composition as the third absorber layer. The sputter deposition process is carried out at a chamber pressure in the range of $5\times10^{-3}$ to $10^{-1}$ Torr and a substrate temperature in the range of 250 to 450° C.

The processing continues as the substrate is conveyed into the next sputter deposition station 61, in which a layer of $CdCl_2$ having a thickness in the range of 0.3 to 0.8 μm is sputtered deposited onto the third absorber layer on the continuously conveying substrate. The sputter deposition of $CdCl_2$ in the station 61 is carried out using a $CdCl_2$ target in an argon sputter environment maintained at a pressure in the range of $5\times10^{-3}$ to $10^{-1}$ Torr. The substrate is heated by the substrate heater 73F to a temperature in the range of 250 to 450° C. during sputter deposition, after which the sputter deposited $CdCl_2$ film is annealed by the annealing heater 75F at a temperature in the range of 450 to 500° C., thereby driving or diffusing the chlorine in $CdCl_2$ into the absorber layers so as to improve the p-type doping and crystallinity thereof. Alternatively, the p-type doping and crystallinity of the absorber layers may be improved by incorporating iodine therein, which can be carried out by using a $CdI_2$ sputter target instead of the $CdCl_2$ target described above. Following the sputter deposition of a $CdI_2$ film having a thickness in the range of 0.3 to 0.8 μm, the $CdI_2$ layer is annealed at a temperature in the range of 400 to 500° C. to thereby drive or diffuse the iodine therein into the absorber layers.

In another preferred embodiment chlorine is directly incorporated into the window layer 37 and the absorber layers 39-43 of the photovoltaic device of FIG. 2 during the deposition thereof. This process can be carried out using another modular continuous deposition apparatus illustrated in FIG. 6, in which all numerals denote the same components or substances as those shown in FIG. 3. The modular continuous deposition apparatus of FIG. 6 is different from the apparatus of FIG. 3 in that the sputter deposition stations 53 and 61 for $CdCl_2$ deposition have been advantageously omitted because the chlorine dopant is now directly incorporated into the window and absorber layers during the deposition thereof.

Figure 6:
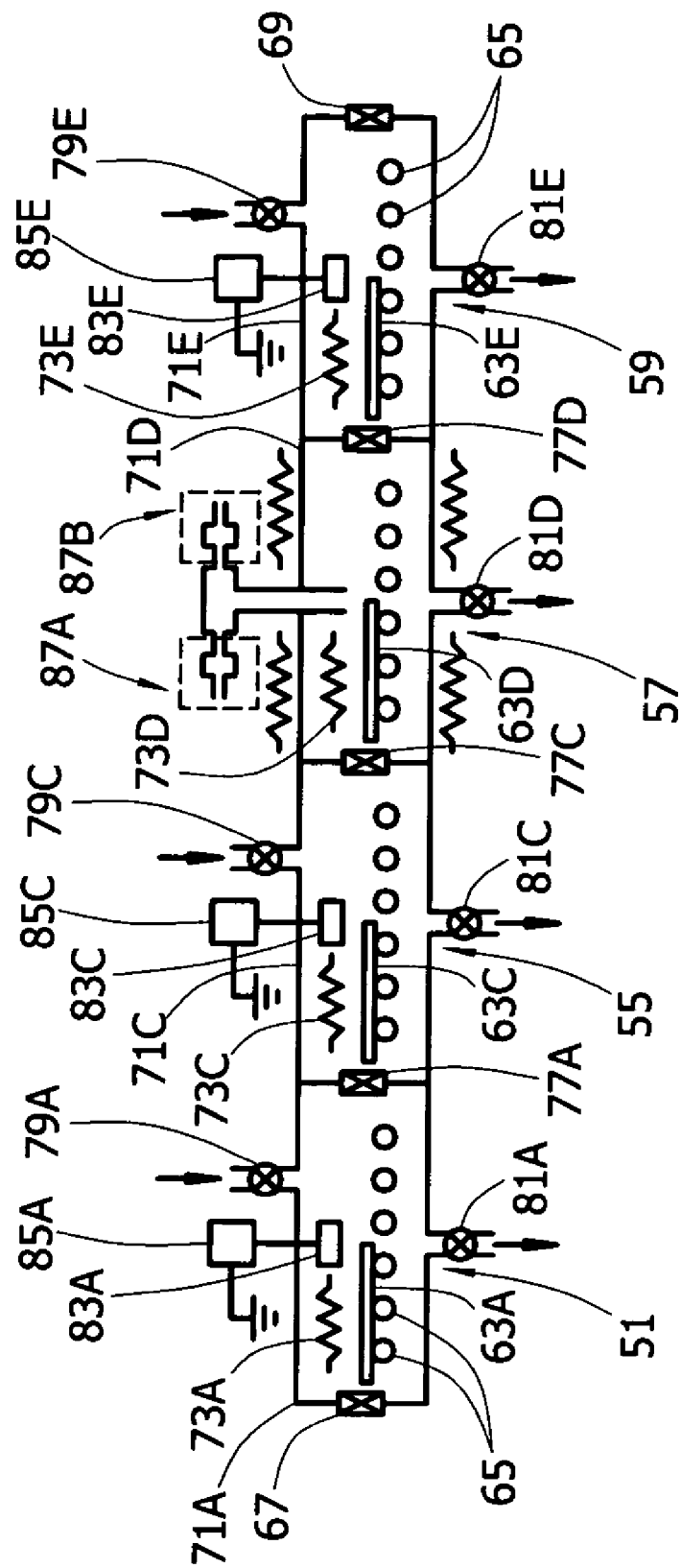
FIG. 6 is a cross sectional schematic view of a modular continuous deposition apparatus having four processing stations in accordance with the present invention.

Fabrication of the window layer, the first absorber layer and the third absorber layer by the sputter deposition stations 51, 55 and 59, respectively, of the apparatus illustrated in FIG. 6 is different from the method described above for the apparatus of FIG. 3 in that the chlorine dopant is directly incorporated into the sputter deposited window and absorber layers during the deposition thereof. This can be carried out by two approaches. The first approach is to employ sputter targets having desired chlorine dopant concentrations instead of the undoped targets. The sputtering of targets made of chlorine doped semiconductors, such as CdS:Cl, ZnS:Cl, CdSe:Cl, CdMgTe:Cl, CdMnTe:Cl, CdZnTe:Cl, CdTe:Cl and CdHgTe:Cl, will result in semiconductor films having substantially the same chemical compositions. In the first approach, except for the use of chlorine doped targets, the rest of the processing steps for sputter depositing chlorine doped window and absorber layers are substantially similar to the above-described sputter deposition steps associated with the apparatus of FIG. 3 for undoped layers. The second approach to sputter deposit chlorine doped window and absorbers layers is by employing a sputtering gas mixture comprising an inert gas, i.e. argon, and a chlorine containing gas such as gaseous chlorine or carbon tetrachloride, thereby forming a chlorine containing sputter atmosphere in the chamber. The chlorine in the sputter atmosphere is incorporated into the sputter deposited window and absorber layers during the formation thereof. Except for replacing the inert sputter atmosphere with the chlorine containing sputter atmosphere, the rest of the processing steps in the second approach are substantially similar to the above-described sputter deposition steps associated with the apparatus of FIG. 3.

The vapor deposition processing of the chlorine doped CdTe main absorber layer by the vapor deposition station 57 will be described with combined reference to FIGS. 4 and 6. There are several approaches to deposit a CdTe film incorporating the chlorine dopant therein by the vapor deposition station 57 illustrated in FIG. 4. One approach is to use a source material made of chlorine doped CdTe pellet or powder, which sublimes to form chlorine gas and CdTe vapor. The chlorine gas and the CdTe vapor entrained in a heated carrier gas, i.e. argon or nitrogen, flow into the process chamber 71D and condense onto the substrate surface to form a chlorine doped CdTe (CdTe:Cl) film thereon. Another approach for vapor deposition of chlorine doped CdTe absorber layer is to employ a heated carrier gas mixture comprising a relatively inert gas, i.e. argon or nitrogen, and a chlorine containing gas such as gaseous chlorine or carbon tetrachloride. The sublimed CdTe vapor entrained in the carrier gas mixture which includes the chlorine containing gas is directed onto the substrate surface, thereby forming a CdTe:Cl film thereon. Yet another approach is to utilize both of the vapor deposition sources 87A and 87B which include, respectively, a CdTe source material and a $CdCl_2$ source material therein to thereby directly deposit a chlorine doped CdTe absorber layer onto the substrate surface. In this approach the sublimation rates of CdTe and $CdCl_2$ source materials are independently controlled by the container heaters 97A and 97B, respectively, to thereby attain optimal dopant concentration in the resultant CdTe absorber layer.

The above-described approaches to deposit the chlorine doped CdTe absorber layer using the vapor deposition station 57 may be extended to the vapor deposition of an iodine doped CdTe (CdTe:I) absorber layer, which can be directly deposited by using a source material made of iodine doped CdTe solid or a heated carrier gas mixture comprising an inert gas and gaseous iodine. The dual deposition source approach utilizing separate CdTe and $CdI_2$ source materials can also be carried out for depositing the iodine doped CdTe absorber layer.

Figure 1:
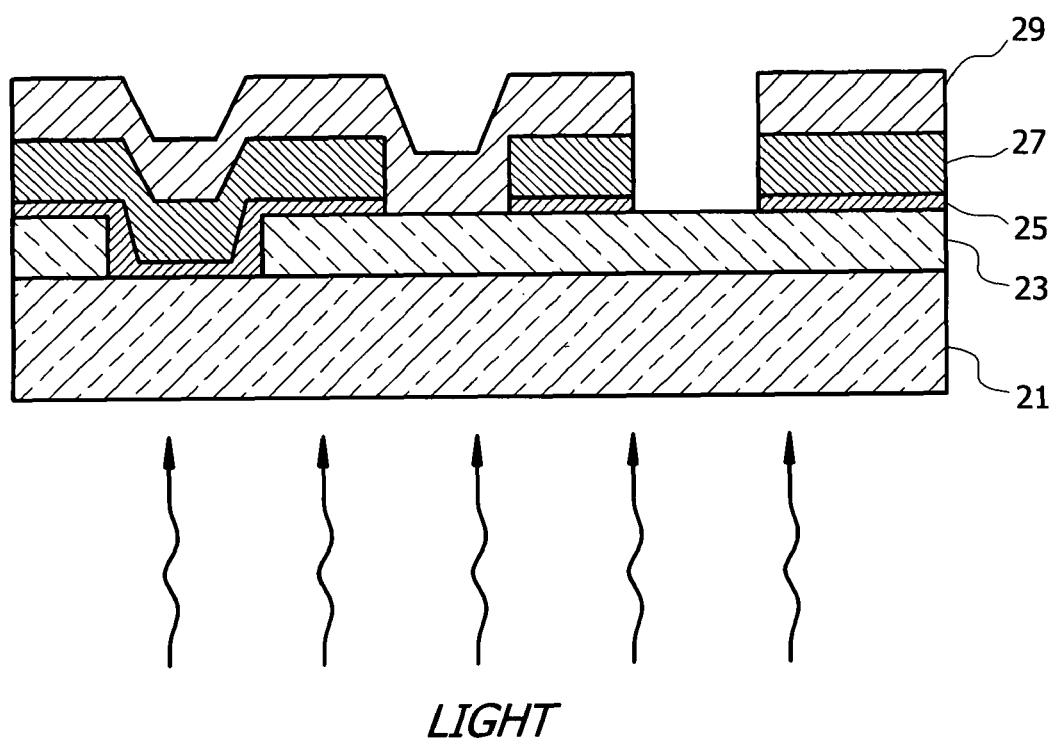
FIG. 1 is a cross sectional schematic view of a conventional CdTe photovoltaic device in the superstrate configuration.
Figure 7:
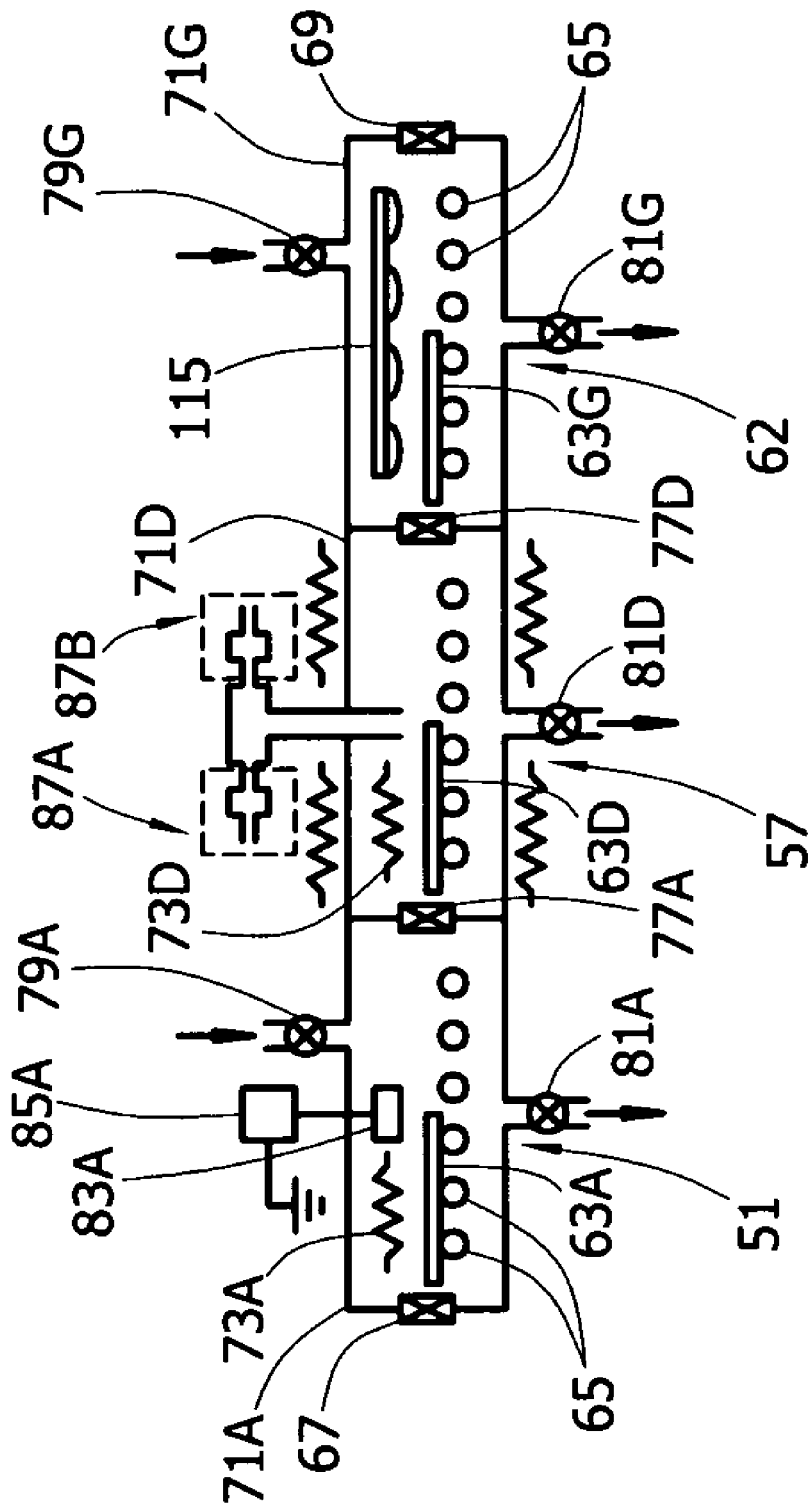
FIG. 7 is a cross sectional schematic view of a modular continuous deposition apparatus having three processing stations in accordance with the present invention.

The modular continuous deposition apparatus of the current invention comprises a plurality of processing stations connected in series. Individual stations can be added, omitted, or rearranged as required by the device and the processing method thereof. It is noted that the continuous deposition apparatus and processing methods of the present invention can also be employed to fabricate other CdTe photovoltaic devices such as the CdTe photovoltaic device of FIG. 1 comprising the n-type window layer 25 and the p-type CdTe absorber layer 27. In yet another preferred embodiment, the semiconductor layers 25 and 27 of the CdTe device in FIG. 1 are deposited by a modular continuous deposition apparatus illustrated in FIG. 7. The apparatus comprises a sputter station 51 for depositing a CdS or $Cd_{1-x}Zn_xS$ window layer doped with chlorine, a vapor deposition station 57 for depositing a CdTe absorber layer doped with chlorine or iodine and an annealing station 62 for annealing the window and absorber layers to thereby improve grain growth thereof. The sputter deposition station 51, the vapor deposition station 57 and components of the stations 51 and 57 for the apparatus in FIG. 7 are identical to those of the apparatus in FIG. 6. The annealing station 62 for the apparatus in FIG. 7 comprises a processing chamber 71G incorporating therein a plurality of rapid thermal annealing (RTA) lamps 115 for heating the substrate 63G, inlet valve 79G and outlet valve 81G for respectively introducing and discharging a processing gas and a roller conveyor 65 for continuously transporting the substrate 63G during the annealing process.

The deposition process for the window layer doped with chlorine and the CdTe absorber layer doped with chlorine or iodine by the sputter deposition station 51 and the vapor deposition station 57, respectively, of the apparatus in FIG. 7 is substantially the same as the deposition process described above for the apparatus in FIG. 6. The fabrication of the CdTe photovoltaic device of FIG. 1 using the modular continuous deposition apparatus of FIG. 7 in accordance with the present invention begins by providing an optically transparent substrate coated with a transparent conductive oxide (TCO) layer thereon. An n-type CdS or $Cd_{1-x}Zn_xS$ window layer doped with chlorine is sputtered deposited onto the TCO coated substrate in the sputter deposition station 51 according to the processing procedures described above for the apparatus of FIG. 6. The sputter deposition process can be carried out using a chlorine doped compound target or a sputter gas which includes gaseous chlorine. Thereafter, a CdTe absorber layer doped with chlorine or iodine is vapor deposited onto the window layer in the vapor deposition station 57 in accordance with the processing procedures described above for the apparatus of FIG. 6.

After the deposition of the CdTe absorber layer in the vapor deposition station 57, the substrate is conveyed into the annealing station 62, in which the conveying substrate is rapidly heated by the RTA lamps 115 to a temperature in the range of 450-600° C. The annealing or heat treatment process increases the grain size and decreases the defect concentration for the window and absorber layers. The gaseous environment in the processing chamber 71G during annealing is controlled by the processing gas which contains argon, nitrogen, oxygen or a mixture thereof. The annealing process in the 71G is preferably carried out at a pressure higher than that in the vapor deposition chamber 71D during the CdTe deposition to thereby avoid re-sublimation of the CdTe film from the substrate surface during annealing.

While the present invention has been shown and described with reference to certain preferred embodiments, it is to be understood that those skilled in the art will no doubt devise certain alterations and modifications thereto which nevertheless include the true spirit and scope of the present invention. For example, the conveyor system, the sputter guns and the vapor deposition conduit in the continuous deposition apparatus can be rearranged in their respective process stations so as to permit the substrate to lie in a position ranging from horizontal to near vertical. Thus the scope of the invention should be determined by the appended claims and their legal equivalents, rather than by examples given.

What is claimed is:

1. A method for fabricating a heterojunction photovoltaic device including three p-type absorber layers in contiguous contact, each of the three absorber layers having a different composition and containing cadmium as a principal constituent, the method comprising the steps of:
    (a) providing an optically transparent substrate coated with a transparent conductive oxide layer thereon;
    (b) depositing an n-type window layer onto said transparent conductive oxide layer by sputter deposition;
    (c) depositing a first p-type absorber layer onto said window layer by sputter deposition;
    (d) depositing a second p-type absorber layer onto said first absorber layer;
    (e) depositing a third p-type absorber layer onto said second absorber layer by sputter deposition;
    (f) depositing a $CdCl_2$ layer onto said third absorber layer; and
    (g) annealing said $CdCl_2$ layer and said absorber layers at a temperature in the range of from about 380° C. to about 450° C. to drive the chlorine from said $CdCl_2$ layer into said absorber layers, thereby forming chlorine doped absorber layers,
    wherein said second p-type absorber layer is formed of CdTe, said third p-type absorber layer is formed of $Cd_{1-z}Hg_zTe$, where z ranges from about 0.15 to about 0.20, said substrate is continuously conveyed in steps (b)-(g) without being exposed to atmospheric environment.

2. The method of claim 1, further comprising the steps of depositing a $CdCl_2$ layer onto said n-type window layer by sputter deposition and then annealing said $CdCl_2$ layer and said n-type window layer at a temperature in the range of from about 380° C. to about 450° C. to drive the chlorine from said $CdCl_2$ layer into said window layer prior to the step of depositing said first absorber layer by sputter deposition.

3. The method of claim 1, wherein said n-type window layer is formed of CdS or $Cd_{1-x}Zn_xS$, where x ranges from more than zero to no more than one.

4. The method of claim 1 wherein said first p-type absorber layer is formed of a p-type semiconductor selected from the group consisting of CdSe, $Cd_{1-y}Mg_yTe$, $Cd_{1-y}Mn_yTe$ and $Cd_{1-y}Zn_yTe$, where y ranges from about 0.05 to about 0.20.

5. The method of claim 1, wherein the step of depositing said second p-type CdTe absorber layer onto said first absorber layer comprises:
    heating a container and a solid CdTe source material therein to a temperature sufficiently high to thereby create a CdTe vapor;
    introducing a heated carrier gas into said container to entrain said CdTe vapor in said heated carrier gas;
    flowing said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;
    heating said substrate to a temperature below the temperatures of said baffle, said conduit and said processing chamber; and
    conveying said substrate on a path near the exit of said heated conduit to receive said CdTe vapor with the distance between the substrate surface and the exit of said heated conduit being controlled to be in the range of from 1 mm to 20 mm, thereby forming a CdTe film on the substrate surface facing said heated conduit.

6. A method for fabricating a heterojunction photovoltaic device including three p-type absorber layers in contiguous contact, each of the three absorber layers having a different composition and containing cadmium as a principal constituent, the method comprising the steps of:
  (a) providing an optically transparent substrate coated with a transparent conductive oxide layer thereon;
  (b) depositing an n-type window layer doped with chlorine onto said transparent conductive oxide layer by sputter deposition;
  (c) depositing a first p-type absorber layer doped with chlorine onto said window layer by sputter deposition;
  (d) depositing a second p-type absorber layer doped with chlorine or iodine onto said first absorber layer; and
  (e) depositing a third p-type absorber layer doped with chlorine onto said second absorber layer by sputter deposition,
  wherein said second p-type absorber layer is formed of CdTe:Cl or CdTe:I, said third p-type absorber layer is formed of $Cd_{1-z}Hg_zTe:Cl$, where z ranges from about 0.15 to about 0.20, said substrate is continuously conveyed in steps (b)-(e) without being exposed to atmospheric environment.

7. The method of claim 6, wherein said n-type window layer is formed of CdS:Cl or $Cd_{1-x}Zn_xS:Cl$, where x ranges from more than zero to no more than one.

8. The method of claim 6 wherein said first p-type absorber layer is formed of a p-type semiconductor selected from the group consisting of CdSe:Cl, $Cd_{1-y}Mg_yTe:Cl$, $Cd_{1-y}Mn_yTe:Cl$ and $Cd_{1-6}Zn_yTe:Cl$, where y ranges from about 0.05 to about 0.20.

9. The method of claim 6, wherein the step of depositing said n-type window layer doped with chlorine onto said transparent conductive oxide layer by sputter deposition is carried out using an undoped compound target sputtered in a chlorine containing gas environment.

10. The method of claim 6, wherein the step of depositing said n-type window layer doped with chlorine onto said transparent conductive oxide layer by sputter deposition is carried out using a chlorine doped compound target.

11. The method of claim 6, wherein the step of depositing said first p-type absorber layer doped with chlorine onto said window layer by sputter deposition is carried out using an undoped compound target sputtered in a chlorine containing gas environment.

12. The method of claim 6, wherein the step of depositing said first p-type absorber layer doped with chlorine onto said window layer by sputter deposition is carried out using a chlorine doped compound target.

13. The method of claim 6, wherein the step of depositing said third p-type absorber layer doped with chlorine onto said second absorber layer by sputter deposition is carried out using an undoped compound target sputtered in a chlorine containing gas environment.

14. The method of claim 6, wherein the step of depositing said third p-type absorber layer doped with chlorine onto said second absorber layer by sputter deposition is carried out using a chlorine doped compound target.

15. The method of claim 6, wherein the step of depositing said second p-type CdTe absorber layer doped with chlorine onto said first absorber layer comprises:
  heating a container and a solid CdTe source material therein to a temperature sufficiently high to thereby create a CdTe vapor;
  introducing a heated carrier gas having a gaseous chlorine constituent into said container to entrain said CdTe vapor in said heated carrier gas;
  flowing said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;
  heating said substrate to a temperature below the temperatures of said baffle, said conduit and said processing chamber; and
  conveying said substrate on a path near the exit of said heated conduit to receive said CdTe vapor and said chlorine containing carrier gas with the distance between the substrate surface and the exit of said heated conduit being controlled to be in the range of from 1 mm to 20 mm, thereby forming a CdTe:Cl film on the substrate surface facing said heated conduit.

16. The method of claim 6, wherein the step of depositing said second p-type CdTe absorber layer doped with chlorine onto said first absorber layer comprises:
  heating a container and a solid CdTe:Cl source material therein to a temperature sufficiently high to thereby create a CdTe vapor and a chlorine gas;
  introducing a heated carrier gas into said container to entrain said CdTe vapor and said chlorine gas in said heated carrier gas;
  flowing said chlorine gas and said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;
  heating said substrate to a temperature below the temperatures of said baffle, said conduit and said processing chamber; and
  conveying said substrate on a path near the exit of said heated conduit to receive said CdTe vapor and said chlorine gas with the distance between the substrate surface and the exit of said heated conduit being controlled to be in the range of from 1 mm to 20 mm, thereby forming a CdTe:Cl film on the substrate surface facing said heated conduit.

17. The method of claim 6, wherein the step of depositing said second p-type CdTe absorber layer doped with chlorine onto said first absorber layer comprises:
  heating a first container and a solid CdTe source material therein to a temperature sufficiently high to thereby create a CdTe vapor;
  heating a second container and a solid $CdCl_2$ source material therein to a temperature sufficiently high to thereby create a $CdCl_2$ vapor;
  introducing a first heated carrier gas into said first container to entrain said CdTe vapor in said first heated carrier gas;
  introducing a second heated carrier gas into said second container to entrain said $CdCl_2$ vapor in said second heated carrier gas;
  flowing said CdTe vapor entrained in said first heated carrier gas and said $CdCl_2$ vapor entrained in said second heated carrier gas into a heated baffle, thereby forming a vapor mixture of CdTe and $CdCl_2$ entrained in a carrier gas mixture of said first heated carrier gas and said second heated carrier gas;
  flowing said vapor mixture entrained in said heated carrier gas mixture from said heated baffle into a heated processing chamber through a heated conduit with said baffle, said conduit and said processing chamber being heated to temperatures sufficiently high to prevent the condensation of said CdTe vapor and said CdCl$_2$ vapor onto the surface thereof;

heating said substrate to a temperature below the temperatures of said baffle, said conduit and said processing chamber; and conveying said substrate on a path near the exit of said heated conduit to receive said vapor mixture of CdTe and CdCl$_2$ with the distance between the substrate surface and the exit of said heated conduit being controlled to be in the range of from 1 mm to 20 mm, thereby forming a CdTe:Cl film on the substrate surface facing said heated conduit.

18. The method of claim 6, wherein the step of depositing said second p-type CdTe absorber layer doped with iodine onto said first absorber layer comprises:

heating a container and a solid CdTe source material therein to a temperature sufficiently high to thereby create a CdTe vapor;

introducing a heated carrier gas having a gaseous iodine constituent into said container to entrain said CdTe vapor in said heated carrier gas;

flowing said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;

heating said substrate to a temperature below the temperatures of said baffle, said conduit and said processing chamber; and conveying said substrate on a path near the exit of said heated conduit to receive said CdTe vapor and said iodine containing carrier gas with the distance between the substrate surface and the exit of said heated conduit being controlled to be in the range of from 1 mm to 20 mm, thereby forming a CdTe:I film on the substrate surface facing said heated conduit.

19. The method of claim 6, wherein the step of depositing said second p-type CdTe absorber layer doped with iodine onto said first absorber layer comprises:

heating a first container and a solid CdTe source material therein to a temperature sufficiently high to thereby create a CdTe vapor;

heating a second container and a solid CdI$_2$ source material therein to a temperature sufficiently high to thereby create a CdI$_2$ vapor;

introducing a first heated carrier gas into said first container to entrain said CdTe vapor in said first heated carrier gas;

introducing a second heated carrier gas into said second container to entrain said CdI$_2$ vapor in said second heated carrier gas;

flowing said CdTe vapor entrained in said first heated carrier gas and said CdI$_2$ vapor entrained in said second heated carrier gas into a heated baffle, thereby forming a vapor mixture of CdTe and CdI$_2$ entrained in a carrier gas mixture of said first heated carrier gas and said second heated carrier gas;

flowing said vapor mixture entrained in said heated carrier gas mixture from said heated baffle into a heated processing chamber through a heated conduit with said baffle, said conduit and said processing chamber being heated to temperatures sufficiently high to prevent the condensation of said CdTe vapor and said CdI$_2$ vapor onto the surface thereof;

heating said substrate to a temperature below the temperatures of said baffle, said conduit and said processing chamber; and conveying said substrate on a path near the exit of said heated conduit to receive said vapor mixture of CdTe and CdI$_2$ with the distance between the substrate surface and the exit of said heated conduit being controlled to be in the range of from 1 mm to 20 mm, thereby forming a CdTe:I film on the substrate surface facing said heated conduit.

20. A method for fabricating a heterojunction photovoltaic device comprising the steps of:

(a) providing an optically transparent substrate coated with a transparent conductive oxide layer thereon;

(b) depositing an n-type window layer onto said transparent conductive oxide layer by sputter deposition;

(c) depositing a p-type absorber layer doped with chlorine or iodine onto said window layer;

(d) annealing said absorber layer by a plurality of rapid thermal anneal (RTA) lamps at a temperature in the range of from about 450° C. to about 600° C. to thereby increase the grain size of said absorber layer, wherein said n-type window layer is formed of an n-type semiconductor selected from the group consisting of CdS, CdS:Cl, Cd$_{1-x}$Zn$_x$S and Cd$_{1-x}$Zn$_x$S:Cl, where x ranges from more than zero to no more than one, said p-type absorber layer is formed of CdTe:Cl or CdTe:I, said substrate is continuously conveyed in steps (b)-(d) without being exposed to atmospheric environment.

21. The method of claim 20, wherein the step of depositing said p-type CdTe absorber layer doped with chlorine onto said n-type window layer comprises:

heating a container and a solid CdTe:Cl source material therein to a temperature sufficiently high to thereby create a CdTe vapor and a chlorine gas;

introducing a heated carrier gas into said container to entrain said CdTe vapor and said chlorine gas in said heated carrier gas;

flowing said chlorine gas and said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;

heating said substrate to a temperature below the temperatures of said baffle, said conduit and said processing chamber; and conveying said substrate on a path near the exit of said heated conduit to receive said CdTe vapor and said chlorine gas with the distance between the substrate surface and the exit of said heated conduit being controlled to be in the range of from 1 mm to 20 mm, thereby forming a CdTe:Cl film on the substrate surface facing said heated conduit.

22. The method of claim 20, wherein the step of depositing said p-type CdTe absorber layer doped with chlorine onto said n-type window layer comprises:

heating a first container and a solid CdTe source material therein to a temperature sufficiently high to thereby create a CdTe vapor;

heating a second container and a solid CdCl$_2$ source material therein to a temperature sufficiently high to thereby create a CdCl$_2$ vapor;

introducing a first heated carrier gas into said first container to entrain said CdTe vapor in said first heated carrier gas;

introducing a second heated carrier gas into said second container to entrain said CdCl$_2$ vapor in said second heated carrier gas;

flowing said CdTe vapor entrained in said first heated carrier gas and said CdCl$_2$ vapor entrained in said second heated carrier gas into a heated baffle, thereby forming a vapor mixture of CdTe and CdCl$_2$ entrained in a carrier gas mixture of said first heated carrier gas and said second heated carrier gas;

flowing said vapor mixture entrained in said heated carrier gas mixture from said heated baffle into a heated processing chamber through a heated conduit with said baffle, said conduit and said processing chamber being heated to temperatures sufficiently high to prevent the condensation of said CdTe vapor and said CdCl$_2$ vapor onto the surface thereof;

heating said substrate to a temperature below the temperatures of said baffle, said conduit and said processing chamber; and conveying said substrate on a path near the exit of said heated conduit to receive said vapor mixture of CdTe and CdCl$_2$ with the distance between the substrate surface and the exit of said heated conduit being controlled to be in the range of from 1 mm to 20 mm, thereby forming a CdTe:Cl film on the substrate surface facing said heated conduit.

23. The method of claim 20, wherein the step of depositing said p-type CdTe absorber layer doped with iodine onto said n-type window layer comprises:

heating a container and a solid CdTe source material therein to a temperature sufficiently high to thereby create a CdTe vapor;

introducing a heated carrier gas having a gaseous iodine constituent into said container to entrain said CdTe vapor in said heated carrier gas;

flowing said CdTe vapor entrained in said heated carrier gas through a heated baffle and into a heated conduit connected to a heated processing chamber with said baffle, said conduit and said processing chamber being heated to temperatures sufficiently high to prevent the condensation of said CdTe vapor onto the surface thereof;

heating said substrate to a temperature below the temperatures of said baffle, said conduit and said processing chamber; and conveying said substrate on a path near the exit of said heated conduit to receive said CdTe vapor and said iodine containing carrier gas with the distance between the substrate surface and the exit of said heated conduit being controlled to be in the range of from 1 mm to 20 mm, thereby forming a CdTe:I film on the substrate surface facing said heated conduit.

24. The method of claim 20, wherein the step of depositing said p-type CdTe absorber layer doped with iodine onto said n-type window layer comprises:

heating a first container and a solid CdTe source material therein to a temperature sufficiently high to thereby create a CdTe vapor;

heating a second container and a solid CdI$_2$ source material therein to a temperature sufficiently high to thereby create a CdI$_2$ vapor;

introducing a first heated carrier gas into said first container to entrain said CdTe vapor in said first heated carrier gas;

introducing a second heated carrier gas into said second container to entrain said CdI$_2$ vapor in said second heated carrier gas;

flowing said CdTe vapor entrained in said first heated carrier gas and said CdI$_2$ vapor entrained in said second heated carrier gas into a heated baffle, thereby forming a vapor mixture of CdTe and CdI$_2$ entrained in a carrier gas mixture of said first heated carrier gas and said second heated carrier gas;

flowing said vapor mixture entrained in said heated carrier gas mixture from said heated baffle into a heated processing chamber through a heated conduit with said baffle, said conduit and said processing chamber being heated to temperatures sufficiently high to prevent the condensation of said CdTe vapor and said CdI$_2$ vapor onto the surface thereof;

heating said substrate to a temperature below the temperatures of said baffle, said conduit and said processing chamber; and conveying said substrate on a path near the exit of said heated conduit to receive said vapor mixture of CdTe and CdI$_2$ with the distance between the substrate surface and the exit of said heated conduit being controlled to be in the range of from 1 mm to 20 mm, thereby forming a CdTe:I film on the substrate surface facing said heated conduit.

25. A modular deposition apparatus for depositing semiconductor compounds containing cadmium, tellurium or sulfur as a principal constituent on substrates to form photovoltaic devices as the substrates are continuously conveyed through the deposition apparatus, comprising:

a plurality of processing stations connected in series, at least one of said processing stations being a sputter deposition station, at least one of said processing stations being a vapor deposition station; and a conveyor system for conveying the substrates in said processing stations and therebetween, wherein said vapor deposition station comprises:

a processing chamber for receiving therein one of the substrates and at least one source material vapor entrained in a carrier gas;

at least one vapor deposition source for generating the at least one source material vapor with the at least one vapor deposition source being connected to a baffle, each of the at least one vapor deposition source including a heated container for subliming a solid source material therein to thereby generate one of the at least one source material vapor;

a conduit connected to said baffle for directing the at least one source material vapor entrained in said carrier gas onto the substrate surface, thereby forming a film thereon; and a means for heating said processing chamber, the at least one vapor deposition source, said baffle and said conduit to temperatures sufficiently high so as to prevent the condensation of the at least one source material vapor onto the surface thereof.

* * * * *